(12) United States Patent
Thompson

(10) Patent No.: US 7,776,394 B2
(45) Date of Patent: Aug. 17, 2010

(54) ATOMIC LAYER DEPOSITION OF METAL-CONTAINING FILMS USING SURFACE-ACTIVATING AGENTS

(75) Inventor: Jeffery Scott Thompson, West Chester, PA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 762 days.

(21) Appl. No.: 11/497,859

(22) Filed: Aug. 1, 2006

(65) Prior Publication Data

US 2007/0037391 A1 Feb. 15, 2007

Related U.S. Application Data

(60) Provisional application No. 60/706,491, filed on Aug. 8, 2005.

(51) Int. Cl.
*C23C 16/00* (2006.01)
*C07F 3/00* (2006.01)

(52) U.S. Cl. ..................... 427/248.1; 556/32
(58) Field of Classification Search ............. 556/32
See application file for complete search history.

(56) References Cited

U.S. PATENT DOCUMENTS

| | | | | |
|---|---|---|---|---|
| 3,900,320 | A * | 8/1975 | Rolker et al. | 430/324 |
| 4,301,196 | A * | 11/1981 | McCormack et al. | 427/99.1 |
| 2002/0081381 | A1 | 6/2002 | Delarosa et al. | |
| 2002/0102818 | A1 | 8/2002 | Sandhu et al. | |
| 2003/0135061 | A1* | 7/2003 | Norman et al. | 556/9 |
| 2003/0143839 | A1* | 7/2003 | Raaijmakers et al. | 438/633 |
| 2004/0092096 | A1* | 5/2004 | Raaijmakers et al. | 438/627 |
| 2004/0219369 | A1* | 11/2004 | Garg et al. | 428/446 |
| 2004/1219369 | | 11/2004 | Diwakar et al. | |
| 2005/0085031 | A1 | 4/2005 | Lopatin et al. | |

FOREIGN PATENT DOCUMENTS

WO WO03/095701 * 11/2003
WO WO 2004/046417 A2 6/2004

OTHER PUBLICATIONS

STN Abstract, published Jun. 24, 2001. Author(s): Chuprakov, Ilya S.; Dahmen, Klaus-Hermann; Source: Proceedings—Electrochemical Society (2000), p. 731. Abstract included for depiction of Co compound.*
Author(s): Chuprakov, Ilya S.; Dahmen, Klaus-Hermann; Source:Proceedings—Electrochemical Socitey (2000), p. 731.*
M. Ritala et. al., Atomic Layer Deposition in Handbook of Thin Film Materials, 2001, vol. 1, Chapter 2, Academic Press.
J. W. Elam et al., Nucleation and Growth during Tungsten Atomic Layer Deposition on SI02 Surfaces, Thin Solid Films, Elsevier-Sequoia S.A. Lausanne, CH, vol. 386(1):41-52, May 1, 2001, XP004230500.
B. S. Lim et al., Atomic Layer Deposition of Transition Metals, Nature Materials, Nature Publishing Group, London, GB, vol. 2:749-754, 2003, XP002997436.
A. Panda et al., Synthesis and Characterization of Three-Coordinate and Related [Beta]-Diketiminate Derivatives of Manganese, Iron and Cobalt, Inorganic Chemistry, vol. 41(15):3909-3916, Jun. 22, 2002, XP002413781.
T. Aaltonen et al., Atomic layer Deposition of Noble Metals: Exploration of the Low Limit of the Deposition Temperature, Journal of Materials Research Mater. Res. Soc USA, vol. 19(11):3353-3358, 2004, XP002413782.

* cited by examiner

*Primary Examiner*—Timothy H Meeks
*Assistant Examiner*—Joseph Miller, Jr.

(57) ABSTRACT

Atomic layer deposition processes for the formation of metal-containing films on surfaces are provided.

4 Claims, No Drawings

ATOMIC LAYER DEPOSITION OF METAL-CONTAINING FILMS USING SURFACE-ACTIVATING AGENTS

FIELD OF THE INVENTION

This invention relates to processes for the formation of Co, Ni, Pt, Pd, Ir or W-containing films on surfaces in atomic layer deposition (ALD) processes using surface-activating agents.

BACKGROUND

Atomic layer deposition (ALD), also known as atomic layer epitaxy, is a process for depositing highly uniform and conformal thin layers of a metal on a surface. The surface is exposed to vapors of the metal precursor and a reducing agent. Such films have a wide variety of applications in semiconductor microelectronics and optical films. The conventional ALD process, which uses a two-step procedure, is described by M. Ritala and M. Leskela in "Atomic Layer Deposition" in Handbook of Thin Film Materials, H. S. Nalwa, Editor, Academic Press, San Diego, 2001, Volume 1, Chapter 2.

In a typical two-step ALD process, there is a self-limiting adsorption of the metal complex to the surface that is controlled by the interaction of the precursor with the substrate in a thermal degradation step. The loss of the ligand is induced thermally, as the metal surface has no functional groups to induce ligand loss chemically. It is desirable that the metal precursor be both stable enough to be transferred into the deposition chamber, and reactive enough to undergo a transformation at the substrate surface.

In a related ALD process, the substrate contains functional groups that react chemically with at least one ligand on the metal-containing precursor. For example, a typical process used to prepare thin, conformal $Al_2O_3$ films uses a substrate with hydroxyl groups. The substrate is contacted with $Al(CH_3)_3$, which reacts with the surface hydroxyl groups to form an adsorbed Al—O complex and liberated methane. When the surface hydroxyl groups are consumed, the reaction stops. Water is then contacted with the Al—O complex on the surface to generate an aluminum oxide phase and additional hydroxyl groups. The process is then repeated as needed to grow an oxide film of desired thickness.

The deposition rate of the $Al(CH_3)_3$ is controlled by the number of surface hydroxyl groups. Once the hydroxyl groups are consumed, no additional $Al(CH_3)_3$ can be adsorbed to the surface.

In other known ALD processes for the deposition of metal films on substrates of interest, there may be no reactive group on the substrate surface to initiate the type of self-limiting reaction that is seen in the $Al_2O_3$ case. For example, in the deposition of a metal barrier layer on a tantalum nitride substrate, the self-limiting adsorption is achieved through the thermal decomposition of the precursor. The precursor is preferably designed to have the volatility and stability needed for transport to the reaction chamber, but also the reactivity to undergo clean thermal decomposition to allow a metal complex to chemisorb to the substrate surface. Often, these processes produce films contaminated with fragments from the metal ligands degraded during the thermal deposition.

US2002/0081381 describes a process for deposition of metal films (Co, Fe, Ni, Pd, Ru, Rh, Ir, Pt, Au, Ag) by an ALD process. The ligands are chosen from β-diketones, monothio-β-ketones, dithio-β-ketones, aminoketones, and silyl-β-ketones. Reducing agents are hydrogen and silane. $Co(acac)_2$ is disclosed as a precursor for the deposition of cobalt films. Oxygen and other oxidizing agents are disclosed in a process that involves formation and reduction of a metal oxide layer.

WO2004/046417 describes the formation of cobalt films by adsorption of $Co(N,N'\text{-diisopropylacetamidinate})_2$ on a substrate surface and reduction with hydrogen gas. Deposition of cobalt is disclosed, with a deposition temperature of 250-350° C. No deposition was obtained at temperatures less than 250° C.

US 2004/0092096 discloses a method for improving the adhesion between a diffusion barrier film and a metal film, by creating a monolayer of oxygen atoms between the diffusion barrier film and the metal film. Suitable metals include Cu, Al, Ni, Co and Ru. In one embodiment, the monolayer is created by exposing the diffusion barrier film to an oxygen-containing reactant and then depositing the metal film via CVD, ALD, PVD or sputtering.

There is a need for a process for the formation of oxide-free metal-containing films that can be conducted at relatively low temperatures and that can provide high quality, uniform films of high purity.

SUMMARY

One aspect of the present invention is a process for depositing a metal-containing film on a surface of a substrate, comprising:
  a. exposing the surface to a surface-activating agent to form a deposit of a surface-activating complex on the surface;
  b. exposing the deposit of the surface-activating complex to a metal precursor to form a deposit of a metal complex on the surface; and
  c. reacting the deposited metal complex with a reducing agent to form an oxide-free metal-containing film on the surface, wherein the metal is selected from the group consisting of Co, Ni, Pt, Pd, Ir, and W.

DETAILED DESCRIPTION

Applicant has discovered novel ALD processes for the deposition of metal-containing films. The processes include the sequential exposure of a substrate surface to three reagents: a surface-activating agent, a metal precursor and a reducing agent.

The first step in one embodiment of a process according to the invention is the deposition on the substrate surface of a surface-activating agent that reacts with the incoming metal precursor in the second step of the reaction to form a non-volatile surface-bound metal precursor complex on the surface in a self-limiting deposition reaction. The surface-bound complex is reacted with a reducing agent to generate the desired film. The steps in the process can be repeated as many times as necessary to attain the desired film thickness.

Another embodiment of the invention is a two-step process in which the deposited surface-activating reagent is exposed to a mixture of the metal precursor and third reagent, with the proviso that that there is no gas-phase reaction between the metal precursor and the third reagent. The two-step process can be repeated as many times as necessary to attain the desired film thickness.

Typically, the processes are conducted in a reaction chamber that can be evacuated, and into which controlled amounts of volatile reagents can be introduced. A means for heating the substrate is also useful.

Suitable substrates include conducting, semi-conducting and insulating substrates, including substrates which are typically used in the electronics industry to manufacture ultra large scale integrated circuits. Suitable substrates typically comprise copper, silicon, silicon dioxide, low k substrates, or low k substrates coated with a barrier layer. Suitable barrier layers include tantalum, tantalum nitride, titanium, titanium nitride, tantalum silicon nitride, titanium silicon nitride, tantalum carbon nitride, tungsten carbonitride, and niobium nitride. "Low k" substrates have a dielectric constant ("k") less than about 4. Suitable low k substrates include doped oxides (e.g., FSG, HSQ, MSQ, HOSP), organics (e.g., SiLK, BCB, FLARE, PAE), highly fluorinated materials (e.g., parylene-F, a-CF, and PTFE), and porous materials (e.g., aerogel and xerogel). Ultra large integrated circuits typically contain many millions of gates and hundreds of millions of individual transistors.

The process includes the deposition of a surface-activating agent on the substrate. The surface-activating agent is chosen to produce a non-volatile complex on the surface suitable for the next step of the ALD process, i.e., the deposition of the metal precursor. The choice of surface-activating agent depends on the ligands coordinated to the metal ion. The metal precursor comprises a basic ligand, and the surface-activating agent should be acidic enough to protonate the coordinated ligand.

The surface-activating group is an organic molecule or water. The surface-activating group chemisorbs to the substrate and serves as a proton donor. The surface-activating group can be an organic acid that can donate a proton to the metal precursor to cause the metal complex to lose a ligand and consequently to chemisorb to the surface. Alternatively, the surface-activating group can add to a coordinated ligand, or displace a coordinated ligand from the metal coordination sphere to form a new complex, e.g., an aquo complex. In the absence of the surface-activating agent, there is no adsorption of the metal precursor to the surface. The deposition of the surface-activating agent can be conducted at temperatures of 20° C. to 400° C., which is lower than the temperature of a typical thermal degradation and thus avoids contamination of the deposited film by ligands.

Suitable surface activation agents include imines, piperidines, nitrogen-containing aromatic heterocycles (e.g., pyrazoles, imidazoles and triazoles), water, and carboxylic acids such as formic acid and acetic acid. Suitable nitrogen-containing aromatic heterocycles include pyrazole, 3,5-dimethylpyrazole, 3,4,5-trimethylpyrazole, 1H-1,2,3-triazole, and 1,2,4-triazole.

Preferably, excess (undeposited) surface-activating agent is evacuated from the reaction chamber before the metal precursor is introduced.

A metal precursor is then brought into contact with the adsorbed surface-activating complex to allow a reaction between the adsorbed complex and the metal precursor. The reaction necessarily stops when the surface activating group is consumed. Excess precursor and by-products can be removed by evacuation or flushing of the reaction chamber.

The reducing agent is then brought into the reaction chamber. Typically, the reducing agent is introduced after any undeposited metal precursor and by-products from the reaction of the metal precursor with the surface activating group have been evacuated from the reaction chamber. Alternatively, the third reagent can be introduced along with the metal precursor, provided there is no gas phase reaction between the two. In the case of metal films, the third reagent is usually a reducing reagent such as hydrogen, silane, 9-BBN (9-borabicyclo[3.3.1]nonane), borane, dihydrobenzofuran, pyrazoline, diethylsilane, dimethylsilane, ethylsilane, methylsilane, or phenylsilane. Desirable reducing agents are volatile and do not decompose on heating. It is also desirable that the reducing agents be of sufficient reducing power to react rapidly on contact with the metal precursor complex deposited on the substrate surface.

The deposition of the metal precursor and the subsequent reaction with the third reagent can be carried out over a wide range of temperatures, typically room temperature to about 450° C., depending on the volatility of the precursor, the desired film and application. Processes using more volatile complexes can be run at lower temperatures. The deposition process improves upon known processes by allowing the use of lower temperatures and producing higher quality, more uniform films.

To be useful in an ALD process, the metal precursor is desirably volatile enough to be sublimed or volatilized without thermal decomposition. The ligands used in the ALD processes are also desirably stable with respect to decomposition and able to desorb from the precursor in a metal-free form following reaction with a surface-activating agent or a reducing agent. Following reduction of or reaction of the metal ion, any remaining ligand is liberated and removed from the surface to prevent its incorporation into the metal-containing layer being formed. Evacuation after the third step may not be necessary. For example, with hydrogen as a reducing agent, it is not necessary to purge the chamber before introduction of the surface-activating agent for the next step.

It is not intended that the processes herein be limited to having 3 individual steps. For example, a two-step process is contemplated, with introduction of the surface-activating agent followed by the metal precursor with hydrogen as the carrier gas.

Suitable metal precursors for use in the processes can be represented by compound (I)

  compound (I)

wherein m=2, and n=0;

M is in the +2 oxidation state and is selected from the group consisting of Co,

Ni, Pt, Pd, and Ir; and

L is an anionic, bidentate ligand derived from HL represented by Structure (I)

Structure (I)

wherein $R^3$ and $R^4$ are independently selected from H, $C_1$-$C_5$ alkyl, and dimethylamino; and $R^1$ and $R^2$ are independently selected from H and $C_1$-$C_5$ alkyl; or $R^1$, $R^3$ and $R^5$ are independently selected from H and $C_1$-$C_5$ alkyl; and $R^2$ and $R^4$ taken together are $(CH_2)_x$, where x=3, 4 or 5; or m=0 and n=3;

M is in the +3 oxidation state and is selected from Co and Ir;

L* is an anionic, bidentate ligand derived from HL*, wherein HL* is selected from the group consisting of β-diketimines represented by Structure (II) and N-acetimidoylacetamidines represented by Structure (III)

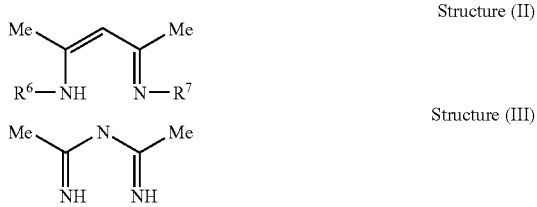

Structure (II)

Structure (III)

wherein

R$_6$ and R$_7$ are independently selected from H, C$_1$-C$_5$ alkyl, and dimethylamino.

The ligands used to prepare metal precursors useful in the processes of this invention can be prepared as described in U.S. Pat. No. 6,030,578, which is incorporated by reference herein, or as described in *Chem. Commun.* 2001, 1174-1175 or *Inorganic Chemistry,* 2003, 42, 7239-7248.

The surface activating group, the ligands on the metal precursor, and the reducing agent are chosen so that the products from the reduction reaction are readily removed from the reaction chamber. The processes disclosed herein allow the use of simple, stable compounds in the ALD of metal-containing films The self-limiting adsorption step relies on the specific reaction between a pre-adsorbed complex and the metal precursor, rather than the thermal degradation of a precursor. Compounds can thus be thermally stable and can be transported into the deposition chamber without degradation. The only reaction in the deposition chamber takes place at the surface with the adsorbed surface activating agent. This process allows the use of compounds that would not be suitable for an ALD process by a thermal degradation route.

EXAMPLES

The present invention is further illustrated by the following Examples. All reagents are available from Sigma-Aldrich Corporation (Milwaukee, Wis., USA), Acros Organics (Morris Plains, N.J.), or Gelest (Morrisville, Pa.). Standard dry box and Schlenk-ware techniques were used in the preparation and handling of the compounds described below. Organic solvents were deaerated with nitrogen and dried over activated 4 Å sieves. Elemental analyses were performed by Micro-Analysis, Inc., Wilmington, Del.

Example 1

Preparation of Bis(N-ethyl-4-ethylimino-2-pentene-2-aminato)cobalt(II)

All manipulations were performed in a Vacuum Atmospheres dry box under a nitrogen atmosphere. The 1,3-diimine ligand, CH$_3$CH$_2$N=C(CH$_3$)—CH$_2$—C(CH$_3$)=N—CH$_2$CH$_3$.HBF$_4$, was prepared according to a literature procedure (S. G. McGeachin, *Canadian Journal of Chemistry,* 46, 1903-1912 (1968)). Lithium N,N'-diethylpentanediketiminate was prepared by the reaction of the free ligand and t-butyl lithium in ether (US 2005/0227007). Cobalt chloride (0.1115 g) was stirred in 10 mL ethanol to yield a blue solution. Lithium N,N'-diethylpentanediketiminate (0.2755 g) was added all at once as a solid. A red-orange color developed rapidly. The reaction mixture was stirred for 0.5 hr. The solvent was removed under vacuum. The resulting material was dissolved in approximately 5 mL toluene. Methanol (10-15 mL) was added to the vial, which was then placed in a freezer at −30° C. Orange crystals grew in the vial on standing and were collected by decantation of the solvent and drying of the crystals. Analyses are consistent with the formation of Co(C$_7$H$_{17}$N$_2$)$_2$. The observed composition was 59.02% C, 9.40% H and 15.13% N. Stoichiometry was confirmed by X-ray crystal structure.

Example 2

Preparation of Bis(N-ethyl-4-ethylimino-2-pentene-2-aminato)cobalt(II)

All manipulations were performed in a Vacuum Atmospheres dry box under a nitrogen atmosphere. Sodium (3-2-amino-4-pentanonate) (0.10 g), prepared by the reaction of the free ligand with sodium methoxide in ethanol followed by removal of solvent, was stirred in 10 mL absolute ethanol. Cobalt(II) chloride (0.070 g) was added all at once to the stirred solution. A deep blue color developed immediately; the solution color changed to red with stirring overnight. The reaction mixture was filtered through Celite® 545; solvent was removed under vacuum. The resulting solid was washed with hexanes to give an orange solution. An orange precipitate formed on standing at −30° C. Solids collected by decanting the solvent and drying the residue. Analyses are consistent with the formation of Co(C$_5$H$_8$NO)$_2$. The observed composition was 47.17% C, 6.29% H and 10.60% N.

Example 3

Deposition of Cobalt Film

The cobalt(II) compound described in Example 1 was used in this example to prepare a cobalt film. The substrate was a ruthenium film (170 Å) on silicon prepared by physical vapor deposition. The reaction chamber was a glass tube (one inch in diameter) with connectors to allow introduction of surface-activating agent, precursor, and reducing agent. One end of the tube was fitted with a ground glass joint to allow connection to a glass vacuum line. The other end of the tube was fitted with a tubulator to allow attachment of tubing for introduction of gases.

A cobalt film was deposited on the Ru wafer in the following manner: The Ru wafers were placed on the floor of the glass tube and cleaned by heating at 200° C. under a hydrogen flow (4% in nitrogen) for one hour; pressure in the deposition chamber was 150-200 mtorr. The precursor and wafer were brought to 95° C. using heating bands and heating tapes. Pyrazole was pulsed into the reaction chamber for 10 sec with a helium flow; pressure in the reaction chamber was 150-200 mtorr. The chamber was then purged for 1 min. Co(II) precursor was then pulsed into the chamber for 2 min; the pressure in the reaction chamber was 150-200 mtorr. The reaction chamber was then purged for 1 min. Dimethylsilane was pulsed into the reaction chamber by opening the valve of the cylinder containing the reagent and immediately closing it. The reaction chamber was purged for 1 min. This cycle was repeated 84 times to generate a thin, conformal cobalt film.

What is claimed is:

1. A process for depositing an oxide-free metal-containing film on a surface of a substrate, comprising:
   a. exposing the surface to a surface-activating agent selected from the group consisting of imines, piperidines, pyrazoles and triazoles to form a deposit of a surface-activating complex on the surface;

b. exposing the deposit of the surface-activating complex to a composition consisting of metal precursor to form a deposit of a metal complex on the surface; and c. reacting the deposited metal complex with a reducing agent to form a metal-containing film on the surface, wherein the metal is selected from the group consisting of Co, Ni, Pt, Pd, Ir, and W, wherein the metal precursor is represented by compound (I)

$$ML_mL^*_n \qquad \text{Compound (I)}$$

wherein m=2, and n=0;

M is in the +2 oxidation state and is selected from the group consisting of Co, Ni, Pt, Pd, and Ir; and L is an anionic, bidentate ligand derived from HL represented by Structure (I)

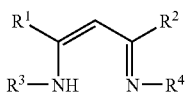

Structure (I)

wherein $R^3$ and $R^4$ are independently selected from the group consisting of H, $C_1$-$C_5$ alkyl, and dimethylamino; and $R^1$ and $R^2$ are independently selected from H and $C_1$-$C_5$ alkyl; or $R^1$ and $R^3$ are independently selected from H and $C_1$-$C_5$ alkyl; and $R^2$ and $R^4$ taken together are $(CH_2)_x$, where x=3, 4 or 5; or m=0 and n=3;

M is in the +3 oxidation state and is selected from Co and Ir;

L* is an anionic, bidentate ligand derived from HL*, wherein HL* is selected from the group consisting of β-diketimines represented by Structure (II) and N-acetimidoylacetamidines represented by Structure (III)

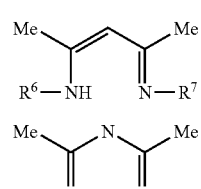

Structure (II)

Structure (III)

wherein $R^6$ and $R^7$ are independently selected from H, $C_1$-$C_5$ alkyl, and dimethylamino.

2. The process of claim 1, wherein the reducing agent is selected from the group consisting of hydrogen, disilane, 9-borabicyclo[3.3.1]nonane, borane, dihydrobenzofuran, pyrazoline, diethylsilane, dimethylsilane, ethylsilane, methylsilane, phenylsilane and silane.

3. The process of claim 1, wherein the substrate comprises copper, silicon, silicon dioxide, a low k substrate, or a low k substrate coated with a barrier layer.

4. The process of claim 3, wherein the barrier layer comprises tantalum, tantalum nitride, titanium, titanium nitride, tantalum silicon nitride, titanium silicon nitride, tantalum carbon nitride, tungsten carbonitride, or niobium nitride.

* * * * *